(12) United States Patent
Majhi et al.

(10) Patent No.: US 8,680,575 B2
(45) Date of Patent: Mar. 25, 2014

(54) SEMICONDUCTOR DEVICE AND METHOD OF FABRICATION

(75) Inventors: Prashant Majhi, Austin, TX (US); Jack Kavalieros, Portland, OR (US); Wilman Tsai, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 379 days.

(21) Appl. No.: 13/016,888

(22) Filed: Jan. 28, 2011

(65) Prior Publication Data

US 2011/0156098 A1 Jun. 30, 2011

Related U.S. Application Data

(63) Continuation of application No. 12/347,883, filed on Dec. 31, 2008, now Pat. No. 7,928,468.

(51) Int. Cl.
*H01L 33/00* (2010.01)

(52) U.S. Cl.
USPC .............................. 257/190; 257/103; 438/22

(58) Field of Classification Search
USPC .......................... 257/103, 190, 29.34; 438/22
See application file for complete search history.

(56) References Cited

U.S. PATENT DOCUMENTS 6,312,967 B1   11/2001   Ikeda

FOREIGN PATENT DOCUMENTS

| WO | WO 2006101452 A1 | * | 9/2006 |
| WO | WO 2007-021017 A1 | | 2/2007 |
| WO | WO 2007021017 A1 | * | 2/2007 |

OTHER PUBLICATIONS

Qiming Li et al., "Morphological Evolution and Strain Relaxation of Ge Islands Grown on Chemically Oxidized Si(100) by Molecular-Bea Epitaxy", Journal of Applied Physics 98, 073504, 2005 American Institute of Physics, pp. 073504-1 to 073504-8.
Office Communication Mailed Oct. 8, 2010, U.S. Appl. No. 12/347,883, filed Dec. 31, 2008.
Office Communication Mailed Jun. 2, 2010, U.S. Appl. No. 12/347,883, filed Dec. 31, 2008.

* cited by examiner

*Primary Examiner* — Thomas L Dickey
(74) *Attorney, Agent, or Firm* — Blakely, Sokoloff, Taylor & Zafman LLP

(57) ABSTRACT

Embodiments of the present invention describe a semiconductor device having an buffer structure and methods of fabricating the buffer structure. The buffer structure is formed between a substrate and a quantum well layer to prevent defects in the substrate and quantum well layer due to lattice mismatch. The buffer structure comprises a first buffer layer formed on the substrate, a plurality of blocking members formed on the first buffer layer, and second buffer formed on the plurality of blocking members. The plurality of blocking members prevent the second buffer layer from being deposited directly onto the entire first buffer layer so as to minimize lattice mismatch and prevent defects in the first and second buffer layers.

11 Claims, 8 Drawing Sheets

US 8,680,575 B2

SEMICONDUCTOR DEVICE AND METHOD OF FABRICATION

This is a Continuation Application of Ser. No. 12/347,883 filed Dec. 31, 2008 now U.S. Pat. No. 7,928,468, which is presently.

BACKGROUND OF THE INVENTION

1. Field of the Invention

The present invention relates to the field of semiconductor processing and more particularly to a buffer structure for a semiconductor device and its methods of fabrication.

2. Discussion of Related Art

The increasing need for faster transistors has led to the use of germanium (Ge) strained quantum well channels as a candidate for replacing strained silicon (Si) channels in field-effect-transistors (FETs). Due to different materials, the Ge quantum well channel is integrated on a Si substrate by transition layers or buffer layers. The buffer layers are formed between the Si substrate and Ge quantum well channel to prevent any defects due to the lattice mismatch between the Si substrate and Ge quantum well channel.

FIG. 1 illustrates a conventional semiconductor device 100 comprising a Si substrate 110 having a graded Ge buffer layer 121 formed thereon. A silicon-germanium (SiGe) buffer layer 122 is formed on the Ge buffer layer 121. An undoped Ge channel layer 140 is formed on the SiGe buffer layer 122. Typically, the Ge channel layer 140 is around 20 nanometers thick. The semiconductor device further comprises multiple SiGe intermediate layers 161, 162, 163 formed on the Ge channel later 140. The intermediate layers 161, 162, 163 are about 10 to 20 nanometers thick. A Si cap layer 180 is formed on intermediate layer 163.

Typically, each of the graded Ge buffer layer 121 and SiGe buffer layer 122 are around 1 microns thick in order to sufficiently prevent defects in the Si substrate 110 and Ge channel layer 140 as well as prevent defects in the Ge buffer layer 121 and SiGe buffer layer 122. However, the thick Ge buffer layer 121 and SiGe buffer layer 122 makes it difficult to integrate the semiconductor device 100 within shallow-trench-isolation (STI) regions, which typically have depths of around 0.2 to 0.4 microns.

DETAILED DESCRIPTION OF THE PRESENT INVENTION

In the following description, numerous specific details are set forth in order to provide a thorough understanding of the present invention. In other instances, well known semiconductor processing techniques and features have not been described in particular detail in order not to unnecessarily obscure the present invention.

Embodiments of the present invention describe a semiconductor device having a buffer structure. In an embodiment of the present invention, the semiconductor device comprises a buffer structure formed between a substrate and a quantum well layer to prevent defects in the substrate and quantum well layer due to lattice mismatch. The buffer structure comprises a first buffer layer formed on the substrate, a plurality of blocking members formed on the first buffer layer, and second buffer formed on the plurality of blocking members. The plurality of blocking members covers any defects in the first buffer layer, thus preventing the defects in the first buffer layer from extending into the second buffer layer. Furthermore, the plurality of blocking members capture any defects that might arise during the selective deposition of the second buffer layer onto the first buffer layer. In one embodiment, the plurality of blocking members are formed by patterning an oxide layer formed on the first buffer layer by an oxidation process. In one embodiment, the plurality of blocking members are ridge-like structures formed on the first buffer layer. In another embodiment, the plurality of blocking members are cube-like structures formed on the first buffer layer.

Figure 1:
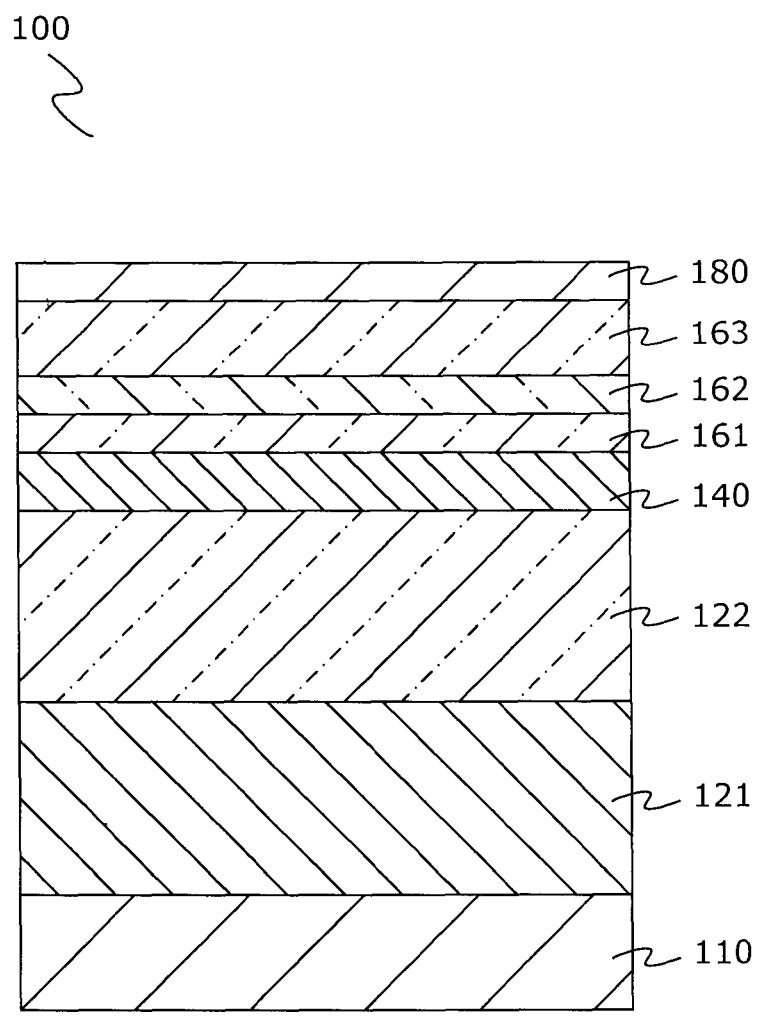
FIG. 1 is a cross-sectional view that illustrates buffer layers in a conventional semiconductor device.
Figure 2:
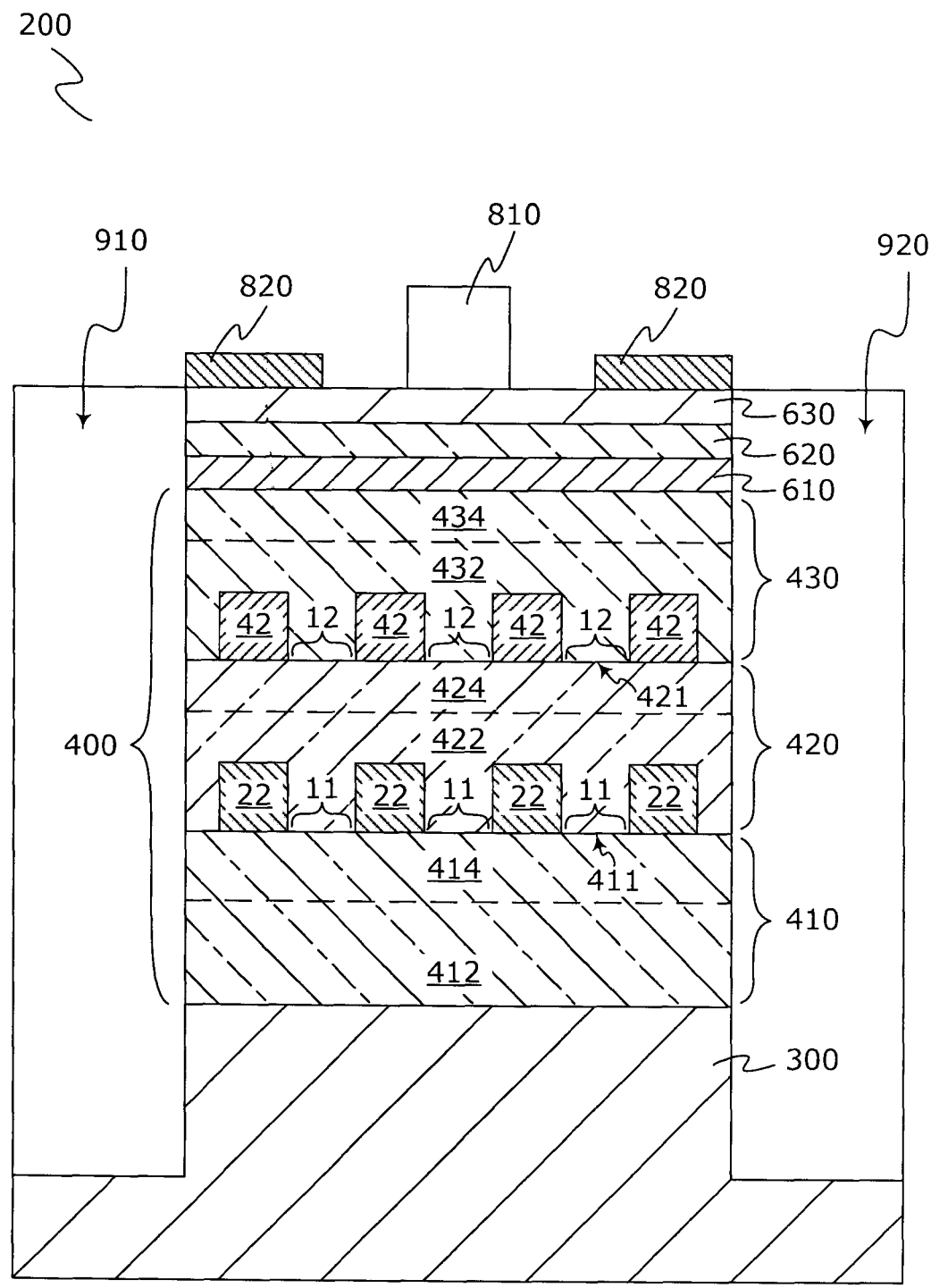
FIG. 2 is a cross-sectional view that illustrates a semiconductor device having a buffer structure in accordance with one embodiment of the present invention.

FIG. 2 illustrates a cross-sectional view of a semiconductor device 200 in accordance with one embodiment of the present invention. The semiconductor device 200 comprises a substrate 300 having a buffer structure 400 formed thereon. A quantum well layer 610 is formed on the buffer structure 400. Buffer structure 400 is formed between the substrate 300 and quantum well layer 610 to minimize lattice mismatch between the substrate 300 and quantum well layer 610 due to the different materials used. By minimizing the lattice mismatch, the buffer structure 400 prevents defects from forming in the substrate 300 and quantum well layer 610.

In one embodiment, the substrate 300 is made of a semiconductor material such as but not limited to silicon (Si), silicon germanium (SiGe), germanium (Ge), and III-V compound semiconductors. In another embodiment, substrate 300 can be a semiconductor heterostructure such as but not limited to a silicon-on-insulator (SOI) substrate, or a multi-layered substrate comprising silicon, silicon germanium, germanium, III-V compound semiconductors, and any combinations thereof. Furthermore, multi-layered substrate also includes insulator-semiconductor stacks, such as but not limited to silicon dioxide on silicon, or metal-oxide on silicon.

In an embodiment of the present invention, the buffer structure 400 comprises a first buffer layer 410 formed on the substrate 300, a second buffer layer 420 formed on the first buffer layer 410, and a third buffer layer 430 formed on the second buffer layer. In one embodiment, the first, second and third buffer layers 410, 420, 430 are epitaxial layers or single crystalline layers, for example SiGe. In one embodiment, the thickness of each of the first, second and third buffer layers 410, 420, 430 is about 10 to 15 nanometers.

In one embodiment, the first buffer layer 410 is made from a material that has a lattice constant larger than the lattice constant of substrate 300. For example, the substrate 300 is made of a semiconductor material, such as Si, and the first buffer layer 410 is made of a semiconductor alloy, such as SiGe. In one embodiment, the first buffer layer 410 is made of SiGe with a range of about 20%-50% Ge concentration. In another embodiment, the first buffer layer 410 can be made of a graded SiGe material.

In one embodiment, the upper portion 414 of the first buffer layer 410 has a higher Ge concentration than its lower portion 412. For example, the upper portion 414 has a Ge concentration that is around 10% to 30% higher than the Ge concentration of the lower portion 412.

The buffer structure 400 further comprises a plurality of first blocking members 22 formed on the top surface 411 of the first buffer layer 410. In one embodiment, the plurality of first blocking members 22 are made from a material that prevents the selective deposition or growth of the second buffer layer 420 onto the first blocking members 22 so as to prevent defects in the second buffer layer 420. For example, in the case where the first and second buffer layers 410, 420 are made of SiGe, the plurality of first blocking members 22 are made of silicon germanium oxide (SiGeOx), silicon nitride (SiN) or any other suitable materials that prevent the selective deposition of second buffer layer 420 onto the plurality of first blocking members 22. Furthermore, the plurality of first blocking members 22 covers any defects in the first buffer layer 410, thus preventing the defects in the first buffer layer 410 from extending into the second buffer layer 420.

In an embodiment of the present invention, the plurality of first blocking members 22 are spaced apart from each other to expose portions 11 of the top surface 411. As shown in FIG. 2, a portion 11 of the top surface 411 is exposed between adjacent first blocking members 22. In one embodiment, the plurality of first members 22 are formed with sufficient sizes to prevent the second buffer layer 420 from depositing directly onto the entire top surface 411 of first buffer layer 410 so as to prevent defects in the second buffer layer 420. In one embodiment, each first blocking member 22 has a height-width aspect ratio of at least 2:1. In a specific embodiment, each first blocking member has a height of about 5 to 20 nanometers and width of about 5 to 10 nanometers. In one embodiment, the plurality of first blocking members 22 occupy at least 50% of the surface area of top surface 411.

Figure 4:
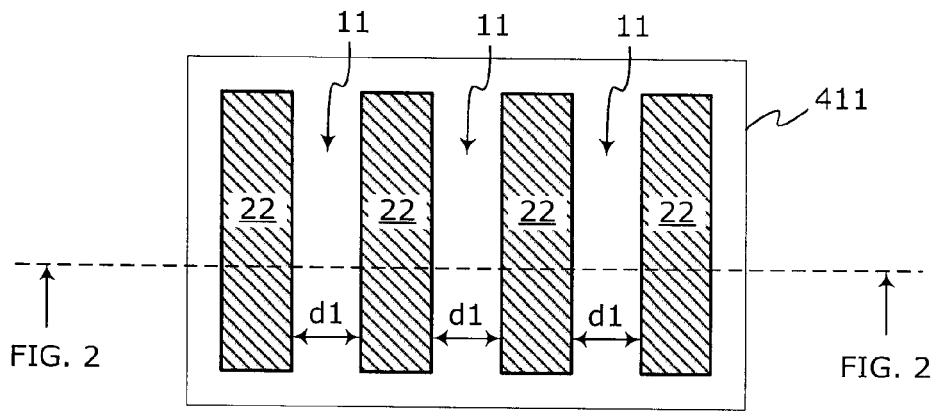
FIG. 4 is a top plan view that illustrates the plurality of first blocking members in accordance with one embodiment of the present invention.

In one embodiment, each of the plurality of first blocking members 22 is a ridge-like structure extending vertically from the top surface 411. FIG. 4 illustrates a top plan view of the plurality of first blocking members 22 as ridge-like structures disposed on the top surface 411. In one embodiment, the plurality of first blocking members 22 are parallel to each other and are spaced apart from each other at a substantially equal distance d1. In a particular embodiment, the distance d1 has a range of about 5 to 20 nanometers.

FIG. 4 illustrates four ridge-like first blocking members 22 formed on the top surface 411. However, it can be contemplated that there can be greater or lesser than four ridge-like first blocking members 22. In one embodiment, there is only one single ridge-like first blocking member 22 formed on the top surface 411. In a specific embodiment, the single ridge-like first blocking member 22 occupies at least 50% of the surface area of top surface 411.

Figure 5:
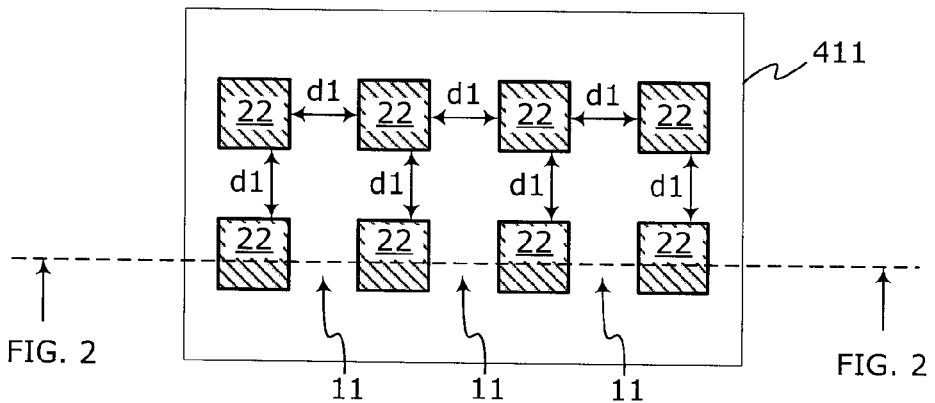
FIG. 5 is a top plan view that illustrates the plurality of first blocking members in accordance with another embodiment of the present invention.

In another embodiment, each of the plurality of first blocking members 22 is a cube-like structure formed on the top surface 411. FIG. 5 illustrates the top plan view of the cube-like first blocking members 22 on the top surface 411. In one embodiment, each first blocking member 22 is spaced apart from an adjacent first blocking member 22 at its side with substantially equal distance d1. FIG. 5 illustrates eight cube-like first blocking members 22 disposed in a 2×4 arrangement on the top surface 411. However, it can be appreciated that there can be greater or lesser than eight cube-like first blocking members 22.

Figure 6:
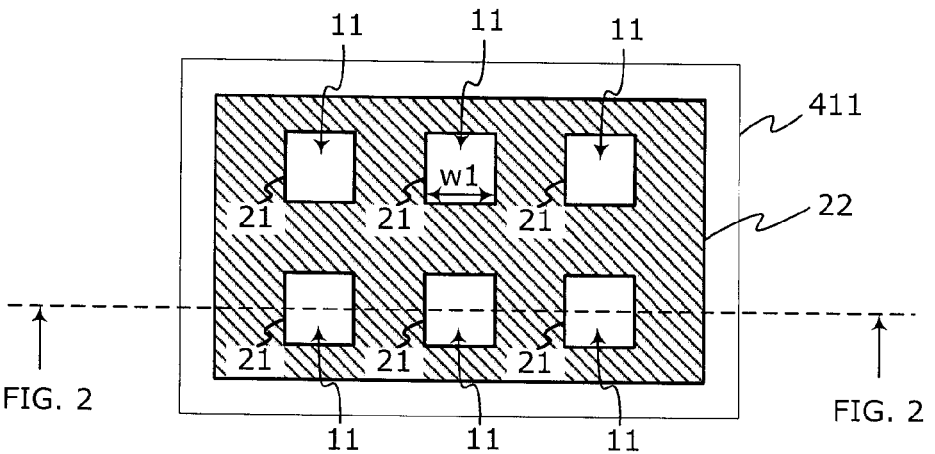
FIG. 6 is a top plan view that illustrates the plurality of first blocking members in accordance with yet another embodiment of the present invention.

In yet another embodiment, there is only one first blocking member 22 formed on the top surface 411 of the first buffer layer 410. The first blocking member 22 comprises a plurality of openings 21 that expose portions 11 of the top surface 411 as shown in FIG. 6. In one embodiment, the plurality of openings 21 are formed with substantially equal width w1. In a particular embodiment, the width w1 have a range of about 5 to 20 nanometers. In one embodiment, the first blocking member 22 comprises six openings 21 in a 2×3 arrangement. However, it can be appreciated that there can be greater or lesser than six openings 21. In one embodiment, the first blocking member 22 comprises one opening 21.

Referring back to FIG. 2, the second buffer 420 is formed onto the exposed portions 11 of the first buffer layer 410 and onto the plurality of first blocking members 22. As previously mentioned, the plurality of first blocking members 22 prevent the second buffer layer 420 from being selectively deposited or grown on the entire top surface 411 of first buffer layer 410 so as to minimize or prevent defects on the second buffer layer 420.

In one embodiment, the second buffer layer 420 is made from a material having a lattice constant that is larger than the lattice constant of first buffer layer 410. In the case where the first buffer layer 410 is made of SiGe, the second buffer layer 420 can be made of SiGe with a higher Ge concentration than the first buffer layer 410 so that the lattice constant of the second buffer layer 420 is larger than the lattice constant of first buffer layer 410. In one embodiment, the second buffer layer 420 has around 10% to 30% higher Ge concentration relative to the Ge concentration of the first buffer layer 410. In an embodiment of the present invention, the second buffer layer 420 is made of a graded SiGe material.

In one embodiment, the upper portion 424 of the second buffer layer 420 has a higher Ge concentration than its lower portion 422. For example, the upper portion 424 has a Ge concentration that is around 10% to 30% higher than the Ge concentration of the lower portion 422.

The buffer structure 400 further comprises a plurality of second blocking members 42 formed on the top surface 421 of the second buffer layer 420. Similarly, the plurality of second blocking members 42 are made from a material that prevents the selective deposition or growth of the third buffer layer 430 onto the second blocking members 42 so as to prevent defects in third buffer layer 430. The plurality of second blocking members 42 are made of silicon germanium oxide (SiGeOx), silicon nitride (SiN) or any other suitable materials that prevent the selective deposition of third buffer layer 430 onto the plurality of second blocking members 42. Furthermore, the plurality of second blocking members 42 covers any defects in the second buffer layer 420, and prevents the defects in the second buffer layer 420 from extending into the third buffer layer 430.

In an embodiment of the present invention, the plurality of second blocking members 42 are spaced apart from each other to expose portions 12 of the top surface 421. As shown in FIG. 2, a portion 12 of the top surface 421 is exposed between adjacent second blocking members 42.

In one embodiment, the plurality of second blocking members 42 have similar shapes and dimensions as the plurality of first blocking members 22. For example, the plurality of first blocking members 22 and plurality of second blocking members 42 have similar height dimensions of about 5 to 20 nanometers and width dimensions of about 5 to 10 nanometers. Furthermore, the plurality of second blocking members 42 are made of similar ridge-like shape as the plurality of first blocking members 22 shown in FIG. 4 or cube-like shape shown in FIG. 5. In one embodiment, a second blocking member 42 is made of similar shape as the first blocking member 22 shown in FIG. 6.

Figure 3:
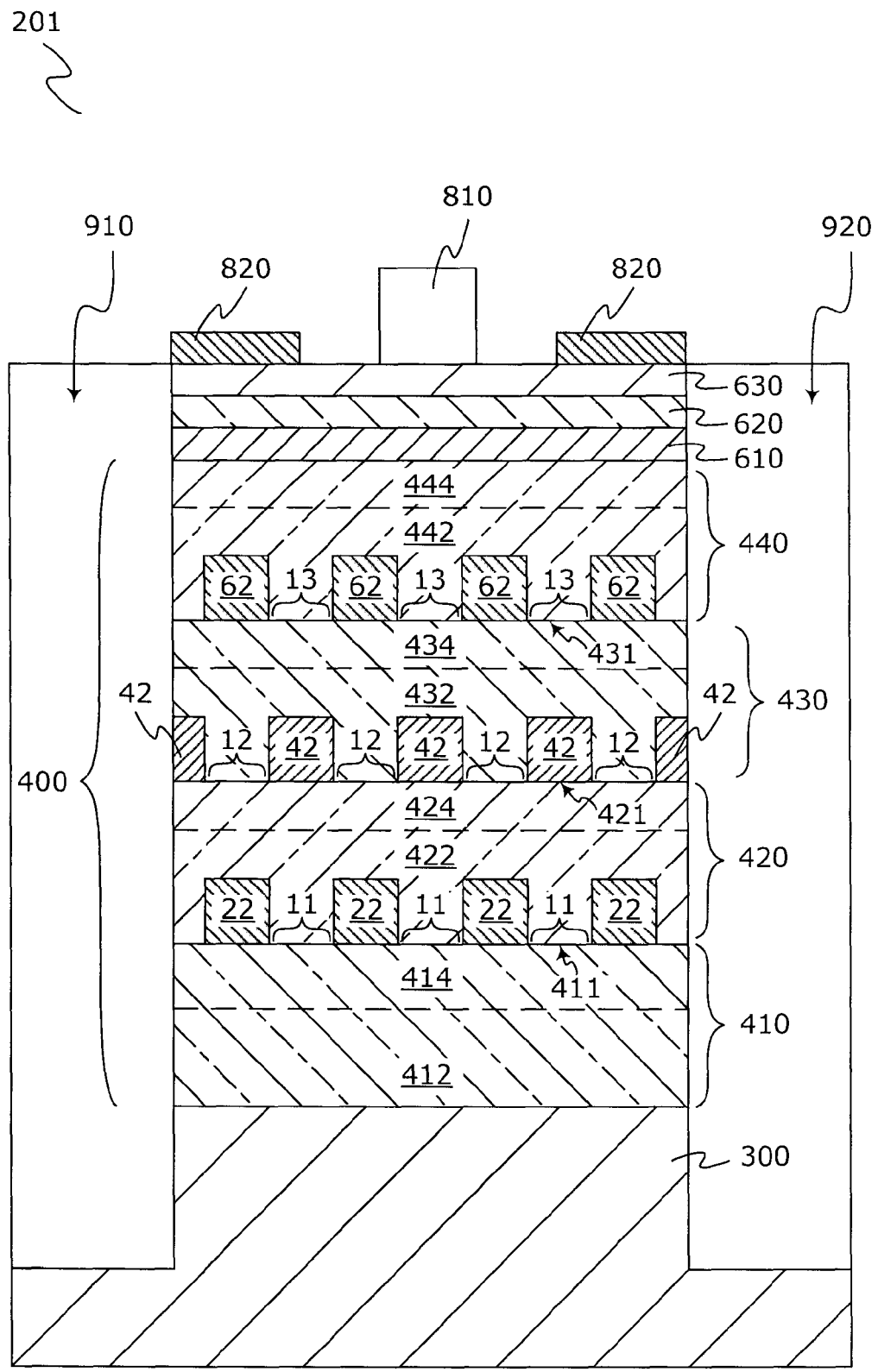
FIG. 3 is a cross-sectional view that illustrates a semiconductor device having a buffer structure in accordance with another embodiment of the present invention.

In an alternative embodiment, the plurality of second blocking members 42 can be made of a different shape from the plurality of first blocking members 22. For example, the plurality of second blocking members 42 are made of a ridge-like structure as shown in FIG. 4 and the plurality of first blocking members 22 are made of a cube-like structure as shown in FIG. 3.

In an embodiment of the present invention, the plurality of second blocking members 42 are aligned to the plurality of first blocking members 22. In other words, the plurality of second blocking members 42 are overlying or directly above the plurality of first blocking members 22 as shown in FIG. 2, and the exposed portions 12 of top surface 421 are directly above the exposed portions 11 of top surface 411.

In an alternative embodiment, the plurality of second blocking members 42 are not aligned to the plurality of first blocking members 22. Briefly referring to FIG. 3, the plurality of second blocking members 42 and the plurality of first blocking members 22 are disposed in a staggered configuration, where the plurality of second blocking members 42 are disposed directly above the exposed portions 11 of the top surface 411, and the exposed portions 12 of top surface 421 are directly above the plurality of first blocking members 22.

The third buffer layer 430, as shown in FIG. 2, is formed onto the exposed portions 12 of the second buffer layer 420 and onto the plurality of second blocking members 42. By forming the plurality of second blocking members 42 on the top surface 421 of second buffer layer 420, it prevents the third buffer layer 430 from being selectively deposited or grown on the entire top surface 421, which minimizes or prevents defects in the third buffer layer 430.

In one embodiment, the third buffer layer 430 is made from a material that has a lattice constant larger than the lattice constant of the second buffer layer 420. In a particular embodiment, the third buffer layer 430 is made from a material with a lattice constant that is larger than the lattice constant of second buffer layer 420 and is substantially equal to the lattice constant of quantum well layer 610.

In the case where the second buffer layer 420 is made of SiGe, the third buffer layer 430 can be made of SiGe with a higher Ge concentration than the second buffer layer 420 so that the lattice constant of third buffer layer 430 is larger than the lattice constant of second buffer layer 420. In one embodiment, the third buffer layer 430 has around 10% to 30% higher Ge concentration relative to the Ge concentration of the second buffer layer 420. In a particular embodiment, the third buffer layer 430 is made of SiGe having a 70% Ge concentration, the second buffer layer 420 is made of SiGe having a 60% Ge concentration, and the first buffer layer 410 is made of SiGe having a 50% Ge concentration. In an embodiment of the present invention, the third buffer layer 430 is made of a graded SiGe material.

In one embodiment, the upper portion 434 of the third buffer layer 430 has a higher Ge concentration than its lower portion 432. For example, the upper portion 434 has a Ge concentration that is around 10% to 30% higher than the Ge concentration of the lower portion 432.

Quantum well layer 610 is formed on the buffer structure 400. In FIG. 2, the quantum well layer 610 is formed on top of the third buffer layer 430. In one embodiment, the quantum well layer 610 has a lattice constant that is larger than or substantially equal to the lattice constant of third buffer layer 430. In one embodiment, the quantum well layer 610 is made of undoped Ge having a thickness of about 20 nanometers.

In an embodiment of the present invention, the semiconductor device 200 further comprises a doped layer 620 formed on the quantum well layer 610. In one embodiment the doped layer 620 is a delta-doped SiGe layer. In one embodiment, the doped layer 620 has a thickness of about 10 nanometers. The semiconductor device 200 further comprises a cap layer 630 formed on the doped layer 620. In one embodiment, the cap layer 630 is made of Si and has a thickness of about 30 nanometers.

In one embodiment, the semiconductor device 200 is formed between shallow trench isolation (STI) regions 910, 920. The buffer structure 400 comprises buffer layers 410, 420, 430 with small thickness of around 10 to 15 nanometers each, which enables the semiconductor device 200 to integrate into the STI regions 910, 920. Furthermore, the buffer layers 410, 420, 430 enable integration into STI regions 910, 920 without sacrificing the capability to effectively prevent defects due to lattice mismatch.

In an embodiment of the present invention, the semiconductor device 200 is a quantum well field-effect-transistor (QWFET) device. In this case, the quantum well layer 610 serves as a channel layer for the QWFET device. The QWFET device comprises a gate electrode 810 formed on the cap layer 630, wherein gate electrode 810 controls the operations of the quantum well channel layer 610. In one embodiment, a dielectric layer (not shown) can be formed between the gate electrode 810 and the cap layer 630. Source and drain contact layers 820 are formed on the cap layer 630 on opposites of the gate electrode 810.

FIG. 2 illustrates the buffer structure 400 having three buffer layers 410, 420, 430. However, it can be contemplated that the buffer structure 400 can have greater or lesser than three buffer layers 410, 420, 430. In one embodiment, the buffer structure 400 comprises only the first and second buffer layers 410, 420. In this case, the quantum well layer 610 is formed on top of the second buffer layer 420. Doped layer 620 and cap layer 630 are similarly formed on the quantum well layer 610.

FIG. 3 illustrates the cross-sectional view of a semiconductor device 201 comprising an alternative embodiment of the buffer structure 400. Similar to FIG. 2, the buffer structure 400 shown in FIG. 3 is formed between the substrate 300 and the quantum well layer 610. The buffer structure 400 in FIG. 3 comprises four buffer layers 410, 420, 430, 440. The first and second buffer layers 410, 420 as well as the plurality of first blocking members 22 shown in FIG. 3 are similar to FIG. 2 and hence will not be discussed in detail here.

In FIG. 3, the plurality of second blocking members 42 are not aligned to the plurality of first blocking members 22. In one embodiment, the plurality of second blocking members 42 and the plurality of first blocking members 22 are disposed in a staggered configuration, where the plurality of second blocking members 42 are disposed directly above the exposed portions 11 of the first buffer layer 410, and the exposed portions 12 of second buffer layer 420 are directly above the plurality of first blocking members 22. The third buffer 430 is formed onto the exposed portions 12 of the second buffer layer 420 and onto the plurality of second blocking members 42.

The buffer structure 400 further comprises a plurality of third blocking members 62 formed on the top surface 431 of the third buffer layer 430. Similarly, the plurality of third blocking members 62 are made from a material that prevents the selective deposition or growth of the fourth buffer layer 440 onto the third blocking members 62 so as to prevent defects in the fourth buffer layer 440. For example, the plurality of third blocking members 62 are made of silicon germanium oxide (SiGeOx), silicon nitride (SiN) or any other suitable materials that prevent the selective deposition of fourth buffer layer 440 onto the plurality of third blocking members 62. Furthermore, the plurality of third blocking members 62 covers any defects in the third buffer layer 430, and prevents the defects in the third buffer layer 430 from extending into the fourth buffer layer 440.

In an embodiment of the present invention, the plurality of third blocking members 62 are spaced apart from each other to expose portions 13 of the top surface 431. As shown in FIG. 3, a portion 13 of the top surface 431 is exposed between adjacent third blocking members 30. In one embodiment, the plurality of third blocking members 62 are made of silicon germanium oxide (SiGeOx).

The plurality of third blocking members 62 are not aligned to the plurality of second blocking members 42. In one embodiment, the plurality of third blocking members 62 and the plurality of second blocking members 42 are disposed in a staggered configuration, where the plurality of third blocking members 62 are disposed directly above the exposed portions 12 of the second buffer layer 420, and the exposed portions 13 of third buffer layer 430 are directly above the plurality of second blocking members 42. In other words, the plurality of third blocking members 62 are aligned to the plurality of first blocking members 22 such that the plurality of third blocking members 62 are overlying the plurality of first blocking members 22, and the exposed portions 13 of third buffer layer 430 are overlying the exposed portions 11 of the first buffer layer 410.

In one embodiment, the plurality of first, second and third blocking members 22, 42, 62 have similar shapes and dimensions. For example, the plurality of first, second and third blocking members 22, 42, 62 have similar height dimensions of about 5 to 20 nanometers and width dimensions of about 5 to 10 nanometers. In one embodiment, the plurality of first, second and third blocking members 22, 42, 62 are made of similar ridge-like structures or cube-like structures as described in relation to FIGS. 4 and 5. Furthermore, a third blocking member 62 and a second blocking member 42 can be made of similar shape as the first blocking member 22 shown in FIG. 6.

In an alternative embodiment, the plurality of first, second and third blocking members 22, 42, 62 can be made of different shapes. For example, the plurality of first and third blocking members 22, 62 are made of a ridge-like structure as shown in FIG. 4 and the plurality of second blocking members 42 are made of a cube-like structure as shown in FIG. 3.

The fourth buffer layer 440 is formed onto the exposed portions 13 of the third buffer layer 430 and onto the plurality of third blocking members 62 as shown in FIG. 3. Forming the plurality of third blocking members 62 on the top surface 431 of third buffer layer 430 prevents the fourth buffer layer 440 from being selectively deposited or grown on the entire top surface 431, which minimizes or prevents defects in the fourth buffer layer 440. In one embodiment, the fourth buffer layer 440 has a thickness of around 10 to 15 nanometers.

In one embodiment, the fourth buffer layer 440 is made from a material that has a lattice constant larger than the lattice constant of the third buffer layer 430. In a particular embodiment, the fourth buffer layer 440 is made from a material with a lattice constant that is larger than the lattice constant of third buffer layer 430 and is substantially equal to the lattice constant of quantum well layer 610.

In the case where the third buffer layer 430 is made of SiGe, the fourth buffer layer 440 can be made of SiGe with a higher Ge concentration than the third buffer layer 430 so that the lattice constant of fourth buffer layer 440 is larger than the lattice constant of third buffer layer 430. In one embodiment, the fourth buffer layer 440 has around 10% to 30% higher Ge concentration relative to the Ge concentration of the second buffer layer 420.

In a particular embodiment, the fourth buffer layer 440 is made of SiGe having a 80% Ge concentration, the third buffer layer 430 is made of SiGe having a 70% Ge concentration, the second buffer layer 420 is made of SiGe having a 60% Ge concentration, and the first buffer layer 410 is made of SiGe having a 50% Ge concentration. In an embodiment of the present invention, the fourth buffer layer 440 is made of a graded SiGe.

In one embodiment, the upper portion 444 of the fourth buffer layer 440 has a higher Ge concentration than its lower portion 442. For example, the upper portion 444 has a Ge concentration that is around 10% to 30% higher than the Ge concentration of the lower portion 442.

Quantum well layer 610 is formed on the fourth buffer layer 440. Furthermore, doped layer 620 is formed on the quantum well layer 610, and cap layer 630 is formed on the doped layer 630 as similarly described in FIG. 2. In an embodiment of the present invention, the semiconductor device 201 shown in FIG. 3 is a QWFET device. Similar to FIG. 2, the QWFET device shown in FIG. 3 comprises a gate electrode 810 and source/drain regions 820 formed on the cap layer 630.

In one embodiment, the semiconductor device 201 is formed between shallow trench isolation (STI) regions 910, 920. The small thickness of the buffer layers 410, 420, 430, 440 (around 10 to 15 nanometers each) enables the semiconductor device 201 to integrate easily into the STI regions 910, 920. Furthermore, the buffer layers 410, 420, 430, 440 enable integration into STI regions 910, 920 without sacrificing the capability to effectively prevent defects due to lattice mismatch.

Figure 7B:
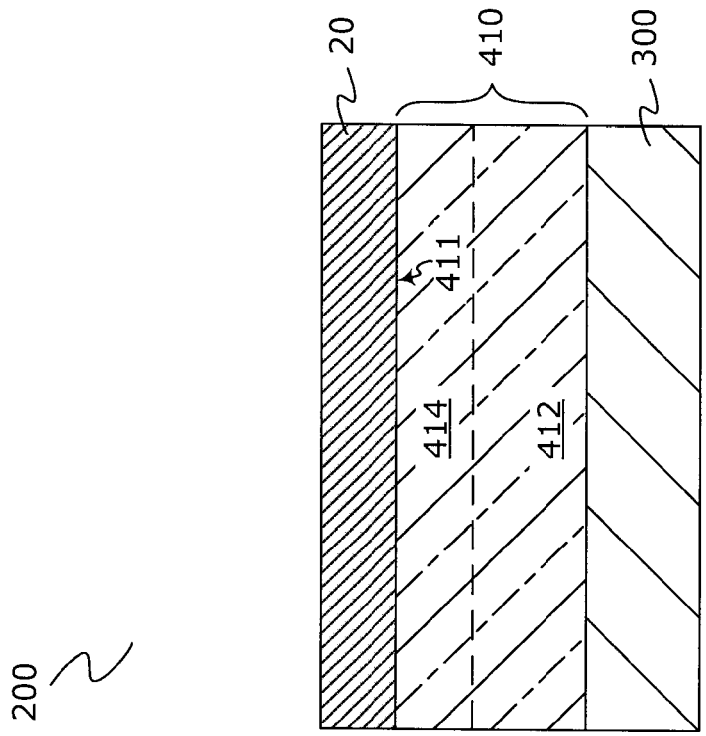
FIGS. 7A-7H are cross-sectional views that illustrate the method of forming the semiconductor device shown in FIG. 2 in accordance with one embodiment of the present invention.
Figure 7A:
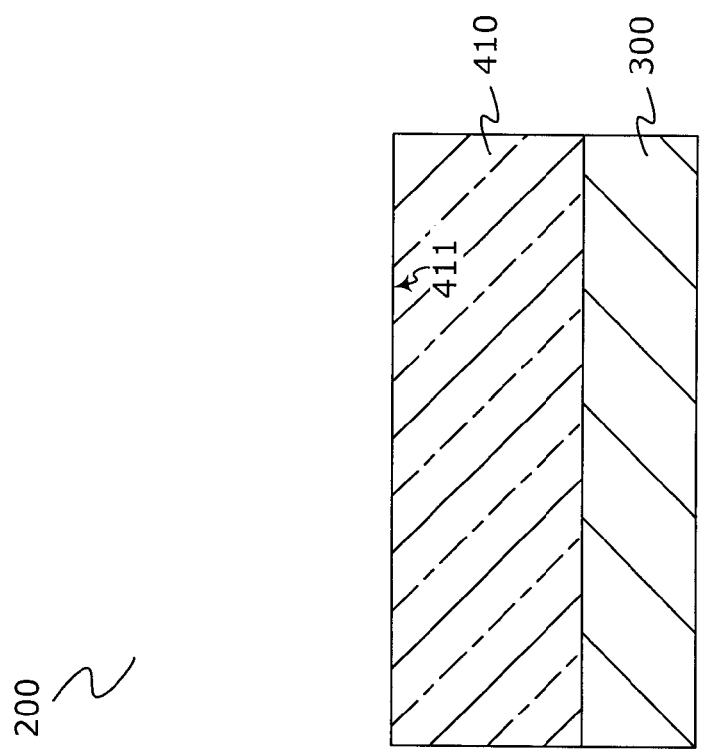

FIGS. 7A-7H illustrate a method of forming the semiconductor device 200 as shown in FIG. 2 in accordance with one embodiment of the present invention. It can be appreciated that the method described in FIGS. 7A-7H is also applicable in forming the semiconductor device 201 shown in FIG. 3. The fabrication of the semiconductor device 200 begins by providing a substrate 300 as shown in FIG. 7A. Then, a first buffer layer 410 is deposited onto the substrate 300 using well known methods, such as but not limited to chemical vapor deposition (CVD). The substrate 300 and first buffer layer 410 are similar to the embodiments described with respect to FIG. 2 and thus will not be discussed in detail here.

In an embodiment of the present invention, the substrate 300 is made of Si and the first buffer layer 410 is made from a material, such as SiGe, which has a lattice constant larger than the lattice constant of substrate 300. In one embodiment, the first buffer layer 410 is made of SiGe with a range of about 20% to 50% Ge concentration. In one embodiment, the thickness of the second buffer layer 420 is about 10 to 15 nanometers.

Next, a plurality of first blocking members 22 are formed on the top surface 411 of the first buffer layer 410. In an embodiment of the present invention, fabrication of the plurality of first blocking members 22 begins by forming an oxide layer 20 on the top surface 411 of the first buffer layer 410. In one embodiment, an oxidation process is performed on the semiconductor device 200 to grow the oxide layer 20 on the top surface 411. In one embodiment, the oxidation process uses a thermal oxidation treatment such as but not limited to dry oxidation or oxygen plasma. For example, if the first buffer layer 410 is made of SiGe, the oxide consumes the SiGe material to form SiGeOx oxide layer 20 on top of the first buffer layer 410.

In addition, the oxidation process produces a condensation effect that increases the Ge concentration at the top surface 411 or upper portion 414 of the first buffer layer 410. In one embodiment, the oxidation process increases the Ge concentration at the top surface 411 or upper portion 414 by at least 10%. For example, if the first buffer layer 410 in FIG. 7A is made of SiGe with 20% Ge concentration, the oxidation process performed in FIG. 7B increases the Ge concentration at the top surface 411 or upper portion 414 by at least 10%. In one embodiment, the Ge concentration at the top surface 411 or upper portion 414 is increased from 20% to 40%.

Figure 7D:
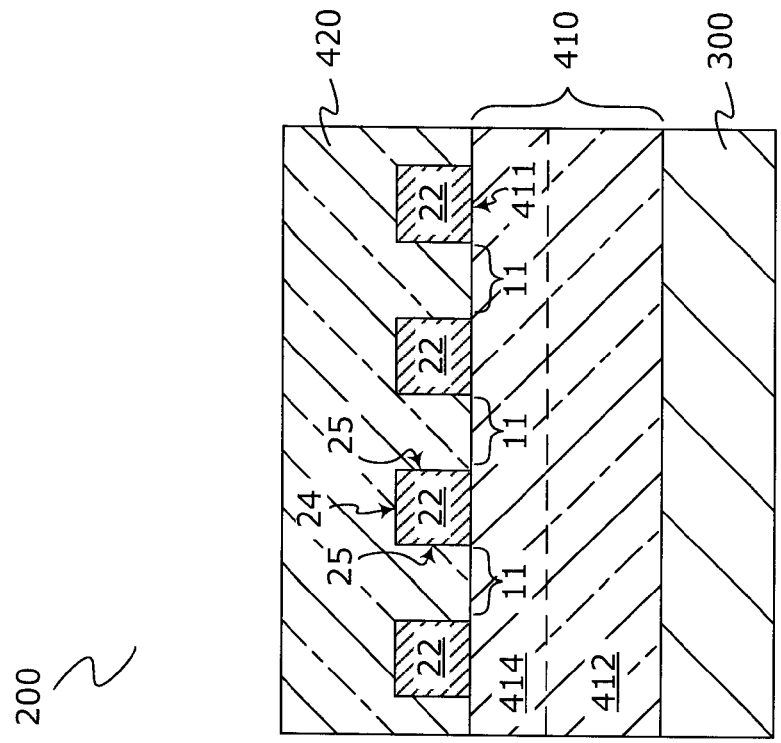
Figure 7C:
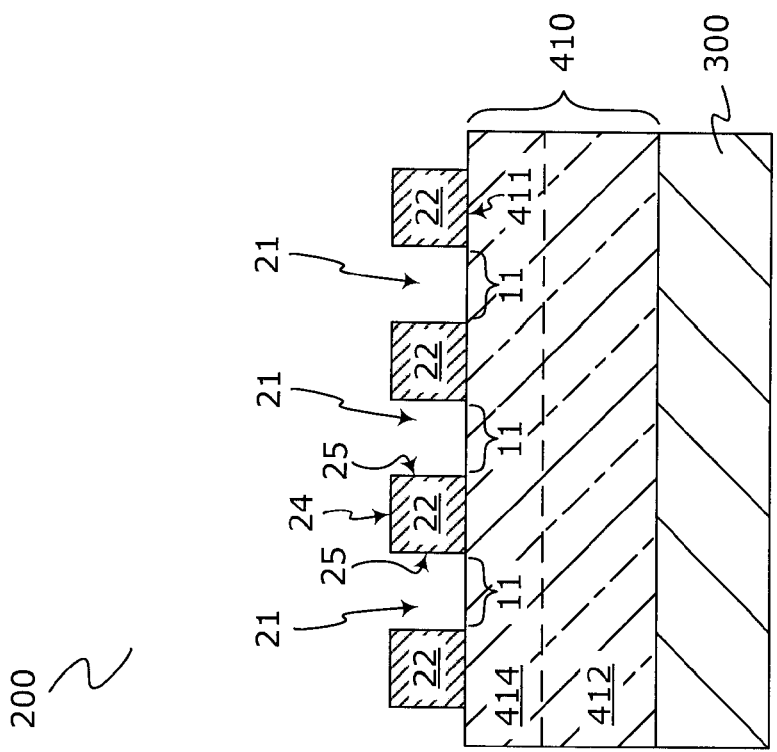

Next, in FIG. 7C, the oxide layer 20 is patterned to form the plurality of first blocking members 22. In one embodiment, the oxide layer 20 is patterned using well known photolithography and etching techniques to form the plurality of first blocking members 22. Each of the plurality of first blocking members 22 comprises a top surface 24 and sidewalls 25, wherein the sidewalls 25 extend from opposite sides of the top surface 24 to the top surface 411 of first buffer layer 410. Furthermore, the plurality of first blocking members 22 define a plurality of openings 21 that expose portions 11 of the top surface 411 of first buffer layer 410. In FIG. 7C, an opening 21 is defined between adjacent first blocking members 22.

In particular, the plurality of first blocking members 22 are made from a material that prevents the selective deposition or growth of the second buffer layer 420 on the first blocking members 22 so as to prevent defects in the second buffer layer 420. The dimensions, structures and arrangement of the plurality of first blocking members 22 formed in FIG. 7C are similar to the embodiments described in relation to FIGS. 2, 4, 5 and 6, and thus will not be discussed in detail here.

After forming the plurality of first blocking members 22, the second buffer layer 420 is then selectively deposited or grown on the first buffer layer 410. Referring to FIG. 7D, the second buffer layer 420 is selectively deposited onto the exposed portions 11 of top surface 411. Furthermore, the second buffer layer 420 also covers or encapsulates the plurality of first blocking members 22. The plurality of first blocking members 22 as previously discussed are made of a material that prevents the selective deposition or growth of the second buffer layer 420 thereon, and this enables their sidewalls 25 to capture any defects that arises during the deposition of the second buffer layer 420.

In one embodiment, the second buffer layer 420 is deposited onto the exposed portions 11 of first buffer layer 410 using a selective epitaxy growth technique. In this case, an epitaxial layer is selectively grown from the first buffer layer 410, in particular from the exposed portions 11, until it covers the plurality of first blocking members 22 and forms the second buffer layer 420 as shown in FIG. 7D. In another embodiment, the second buffer layer 420 can be selectively deposited using well known methods, such as but not limited to chemical vapor deposition (CVD). In a particular embodiment, the second buffer layer 420 is deposited by thermal CVD using a germanium-containing precursor, such as germane ($GeH_4$), and silicon-containing precursor, such as silane ($SiH_4$) or disilane ($Si_2H_6$).

In one embodiment, the second buffer layer 420 is made from a material having a lattice constant that is substantially equal to or is larger than the lattice constant of first buffer layer 410. For example, if the first buffer layer 410 is made of SiGe with 40% Ge concentration at the upper portion 414 as previously described in relation to FIG. 7B, then the second buffer layer 420 can be made of SiGe with a 50% Ge concentration. In one embodiment, the thickness of the second buffer layer 420 is about 10 to 15 nanometers.

In an embodiment of the present invention, the methods described in relation to FIGS. 7B, 7C and 7D can be repeated to form additional buffer layers. In one embodiment, a plurality of second blocking members 42 are formed on the top surface 421 of the second buffer layer 420. The fabrication of the plurality of second blocking members 42 begins by forming an oxide layer 40 on the top surface 421 of the second buffer layer 420 as shown in FIG. 7E. Similarly, the oxidation process previously described in FIG. 7B can be performed on the semiconductor device 200 to form the oxide layer 40 on the top surface 421.

Furthermore, the oxidation process increases the Ge concentration at the top surface 421 or upper portion 424 of the second buffer layer 420 through the condensation effect. In one embodiment, the oxidation process increases the Ge concentration at the top surface 421 or upper portion 424 by at least 10%. For example, in the case where the second buffer layer 420 from FIG. 7D is made of SiGe with 50% Ge concentration, the oxidation process performed in FIG. 7E increases the Ge concentration at the top surface 421 or upper portion 424 by at least 10%. In one embodiment, the Ge concentration at the top surface 421 or upper portion 424 is increased from 50% to 70%.

Figure 7F:
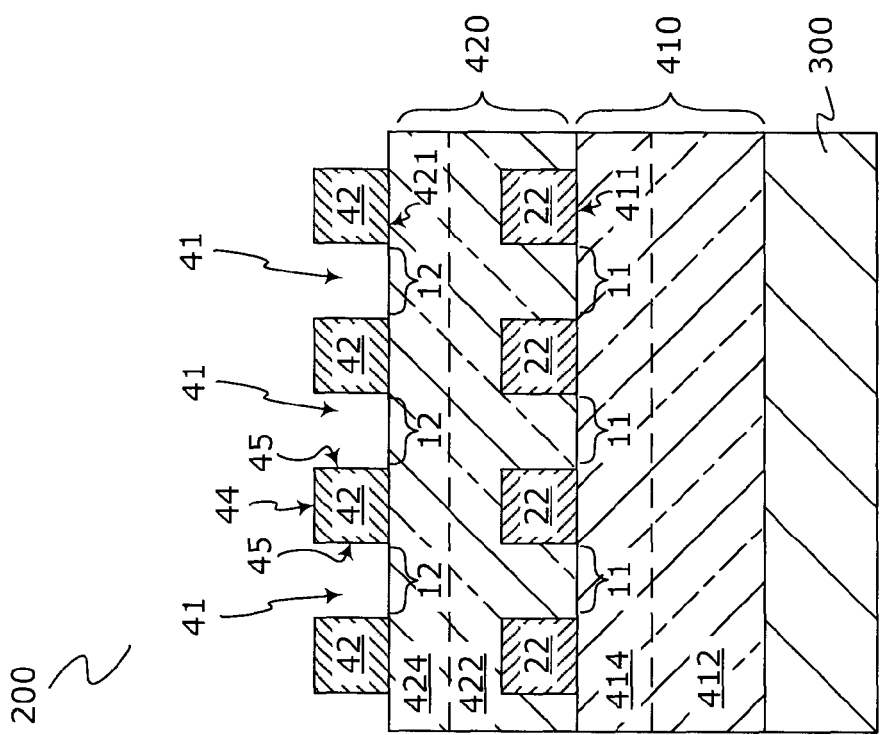
Figure 7E:
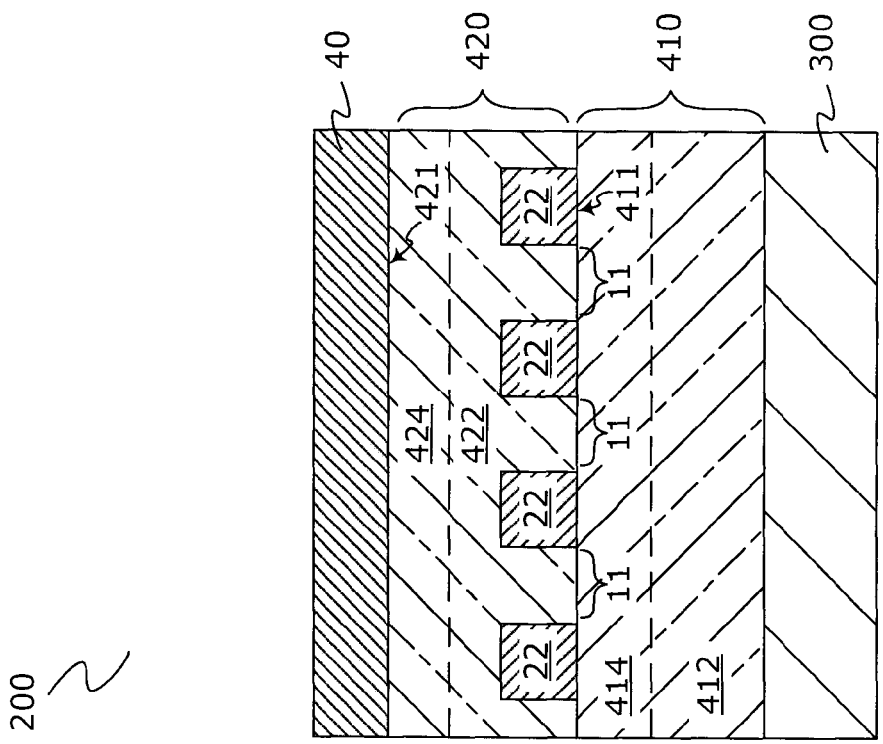

Next, in FIG. 7F, the oxide layer 40 is patterned to form the plurality of second blocking members 42. In one embodiment, the oxide layer 40 is patterned using well known photolithography and etching techniques to form the plurality of second blocking members 42. Each of the plurality of second blocking members 42 comprises a top surface 44 and sidewalls 45, wherein the sidewalls 45 extend from opposite sides of the top surface 44 to the top surface 421 of second buffer layer 420. Furthermore, the plurality of second blocking members 42 define a plurality of openings 41 that exposes portions 12 of the top surface 421 of second buffer layer 420. In FIG. 7F, an opening 41 is defined between adjacent second blocking members 42.

The plurality of second blocking members 42 are made from a material that prevents the selective deposition or growth of the third buffer layer 430 on the second blocking members 42 so as to prevent defects in the third buffer layers 430. In one embodiment, the plurality of second blocking members 42 have similar shapes and dimensions as the plurality of first blocking members 22. For example, the plurality of first blocking members 22 and plurality of second blocking members 42 have similar height dimensions of about 5 to 20 nanometers and width dimensions of about 5 to 10 nanometers. The structures of the plurality of second blocking members 42 formed in FIG. 7F are similar to the embodiments described in relation to FIGS. 2, 4, 5 and 6, and thus will not be discussed in detail here.

In an embodiment of the present invention, the plurality of second blocking members 42 are aligned to the plurality of first blocking members 22 as shown in FIG. 7F. In this case, the plurality of second blocking members 42 are overlying or directly above the plurality of first blocking members 22, and the exposed portions 12 of top surface 421 are directly above the exposed portions 11 of top surface 411.

Figure 7G:
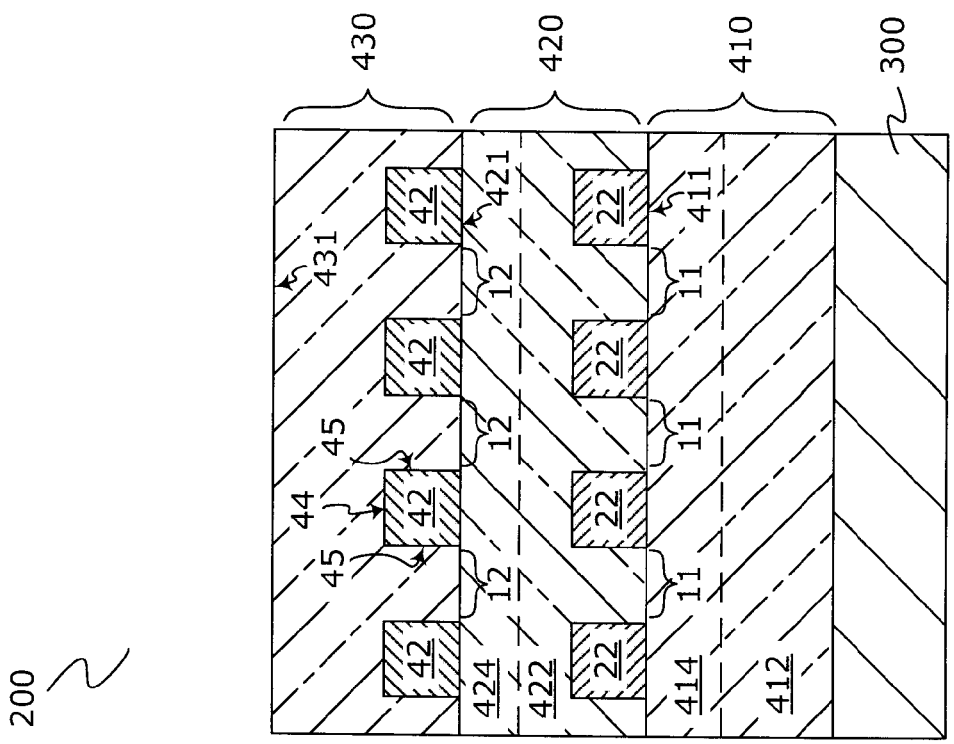

Next, in FIG. 7G, the third buffer layer 430 is selectively deposited or grown on the second buffer layer 420. In particular, the third buffer layer 430 is selectively deposited onto the exposed portions 12 of top surface 421. Furthermore, the third buffer layer 430 also covers or encapsulates the plurality of second blocking members 42. The plurality of second blocking members 42 are made of a material that prevents the selective deposition or growth of the third buffer layer 420 thereon, which enables their sidewalls 45 to capture any defects that arises during the deposition of the third buffer layer 430. The third buffer layer 430 is deposited using similar techniques as the second buffer layer 420 described in FIG. 7D, and thus will not be discussed in detail here.

In one embodiment, the third buffer layer 430 is made from a material having a lattice constant that is larger than the lattice constant of second buffer layer 420. For example, if the second buffer layer 420 is made of SiGe with 70% Ge concentration at the upper portion 424 as previously described in relation to FIG. 7E, then the third buffer layer 430 can be made of SiGe with a 80% Ge concentration. In one embodiment, the thickness of the third buffer layer 430 is about 10 to 15 nanometers.

In an embodiment of the present invention, the quantum well layer 610 is deposited onto the top surface 431 of the third buffer layer 430 formed in FIG. 7G. After quantum well layer 610 is deposited onto the top surface 431, doped layer 620 and cap layer 630 are formed onto the quantum well layer 610 as shown in FIG. 2. In the case where the semiconductor device 200 is a QWFET, gate electrode 810, and source and drain regions 820 are formed on cap layer 630. The STI regions 910, 920 are then formed at the opposite sides of the QWFET to isolate it from other devices.

Figure 7H:
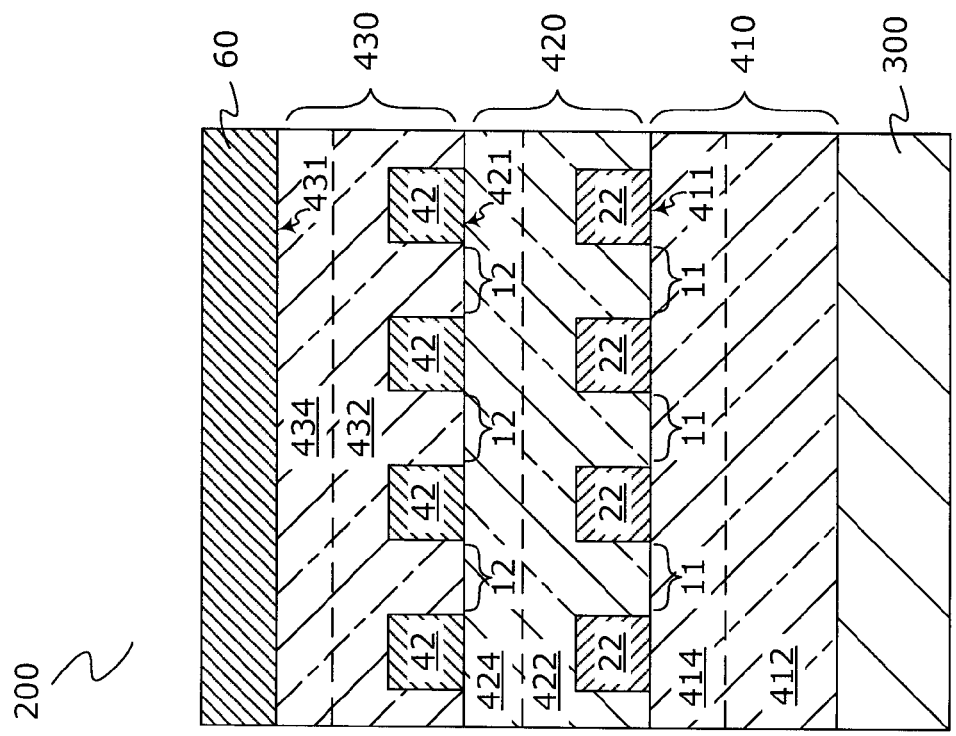

In an alternative embodiment, an oxidation process similar to FIG. 7B is performed on the third buffer layer 430 to increase the Ge concentration at the top surface 431 or upper portion 434 before depositing the quantum well layer 610 on the third buffer layer. Referring to FIG. 7H, the oxidation process forms an oxide layer 60 on the top surface 431 of third buffer layer 430.

Similarly, the oxidation process increases the Ge concentration at the top surface 431 or upper portion 434 of the third buffer layer 430 through the condensation effect. In one embodiment, the oxidation process increases the Ge concentration at the top surface 431 or upper portion 434 by at least 10%. For example, if the third buffer layer 430 in FIG. 7G is made of SiGe with 80% Ge concentration, the oxidation process performed in FIG. 7H increases the Ge concentration at the top surface 431 or upper portion 434 by at least 10%. In one embodiment, the Ge concentration at the top surface 431 or upper portion 434 is increased from 80% to 90%.

Subsequently, the oxide layer 60 is removed from the top surface 431 of the third buffer layer 430 using well known techniques, such as but not limited to dry or wet etching. After the oxide layer 60 is removed, the quantum well layer 610 is then deposited onto the top surface 431 of third buffer layer 430 as illustrated in FIG. 2. Furthermore, doped layer 620 and cap layer 630 are formed onto the quantum well layer 610. In the case where the semiconductor device 200 is a QWFET, gate electrode 810, and source and drain regions 820 are formed on cap layer 630. The STI regions 910, 920 are then formed at the opposite sides of the QWFET to isolate it from other devices.

FIG. 7A-7H illustrates the method of forming the buffer structure 400 shown in FIG. 2 in accordance with one embodiment of the present invention. In an alternative embodiment, the oxide layer 20 shown in FIG. 7B is formed by well known deposition techniques such as but not limited to PVD or CVD. Then, the oxide layer 20 is similarly patterned to form the plurality of first blocking members 22 as shown in FIG. 7C. In this case, the oxide layer deposition does not increase the Ge concentration at the top surface 411 of the first buffer layer 410. In other words, the Ge concentration remains substantially uniform in both the lower and upper portions 412, 414 of the first buffer layer 410. Similarly, the oxide layers 40, 60 shown in FIGS. 7E and 7H can also be formed by well known CVD or PVD techniques. In this case, the Ge concentration also remains substantially uniform in both the second and third buffer layers 420, 430.

In another embodiment, the oxidation process described in FIG. 7B can be repeated to further increase the Ge concentration at the top surface 411 or upper portion 414. For example, after forming the oxide layer 20 as shown in FIG. 7B, the oxide layer 20 is removed from the first buffer layer 410 using well known etching techniques. Then, the oxidation process is repeated to form another oxide layer 20' on the top surface 411. The subsequently formed oxide layer 20' is then patterning according to the method described in FIG. 7C to form the plurality of first blocking members 22. Similarly, the oxidation process can be repeated (at FIGS. 7E and 7H) to increase the Ge concentration at the respective top surface and upper portion of the second and third buffer layers 420, 430. In one embodiment, after the oxide layer 20 formed by the oxidation process is removed from the first buffer layer 410, a subsequent oxide layer 20' can be deposited by using well known CVD or PVD techniques instead using the oxidation process. After deposition, the subsequently formed oxide layer 20' is then patterned to form the plurality of first blocking members 22.

Several embodiments of the invention have thus been described. However, those ordinarily skilled in the art will recognize that the invention is not limited to the embodiments described, but can be practiced with modification and alteration within the spirit and scope of the appended claims that follow.

We claim:

1. A semiconductor device comprising,
   a first semiconductor layer having a first lattice constant;
   a buffer structure disposed on the first semiconductor layer comprising:
   a first buffer layer disposed directly on and in contact with the first semiconductor layer wherein the first buffer layer has a second lattice constant larger than the first lattice constant;
   a first plurality of blocking members formed on a top surface of the first buffer layer, the first plurality of blocking members spaced apart from each other so as to expose portions of the top surface of first buffer layer; and
   a second buffer layer disposed on the first plurality of blocking members and exposed portions of top surface of first buffer layer wherein the second buffer layer has a third lattice constant larger than the second lattice constant; and
   a second plurality of blocking members formed on a top surface of the second buffer layer, the second plurality of blocking members spaced apart from each other so as to expose portions of the top surface of second buffer layer; and
   a third buffer layer formed onto the second plurality of blocking members and exposed portions of top surface of second buffer layer; and
   a second semiconductor layer formed on the buffer structure.

2. The semiconductor device of claim 1, wherein the second plurality of blocking members are aligned to the first plurality of blocking members such that the second plurality of blocking members are disposed directly above the first plurality of blocking members, and the exposed portions of the top surface of second buffer layer are directly above the exposed portions of the top surface of first buffer layer.

3. A method of forming a semiconductor device comprising:
- providing a first semiconductor layer; depositing a first buffer layer on the first semiconductor layer;
- performing an oxidation process on the top surface of the first buffer layer to form a first oxide layer on the top surface of the first buffer layer;
- forming a plurality of blocking members on a top surface of the first buffer layer, the plurality of blocking members defining a plurality of openings that expose portions of the top surface of first buffer layer;
- depositing a second buffer layer onto the plurality of blocking members and exposed portions of top surface of first buffer layer; and
- forming a second semiconductor layer on the second buffer layer.

4. The method of claim 3, wherein the first semiconductor layer comprises a first material;
- wherein the first buffer layer and second buffer layer each comprises the first material and a second material; and
- wherein the second semiconductor layer comprises the second material.

5. The method of claim 4, wherein forming the first plurality of blocking members comprises:
- depositing an oxide layer on the top surface of first buffer layer; and
- patterning the oxide layer to form the plurality of blocking members and to define plurality of openings that expose portions of the top surface of first buffer layer.

6. The semiconductor device of claim 4, wherein the first material is silicon and the second material is germanium.

7. The method of claim 4, wherein the oxidation process increases the concentration level of the second material at the top surface.

8. The method of claim 7, further comprising:
- patterning the first oxide layer to form the plurality of blocking members and to define plurality of openings that expose portions of the top surface of first buffer layer.

9. The method of claim 8, wherein the second buffer layer is deposited with a concentration level of second material that is substantially equal to or is higher than the increased concentration level of the second material at the top surface of first buffer layer.

10. The method of claim 7, further comprising:
- removing the first oxide layer from the top surface of first buffer layer;
- performing an oxidation process on the top surface of first buffer layer to form a second oxide layer on the top surface of first buffer layer, wherein the oxidation process further increases the concentration level of the second material at the top surface; and
- patterning the second oxide layer to form the plurality of blocking members and to define plurality of openings that expose portions of the top surface of first buffer layer.

11. The method of claim 7, further comprising:
- removing the first oxide layer from the top surface of first buffer layer;
- depositing a second oxide layer on the top surface of the first buffer layer; and
- patterning the second oxide layer to form the plurality of blocking members and to define plurality of openings that expose portions of the top surface of first buffer layer.

* * * * *